(12) United States Patent
Tanbakuchi et al.

(10) Patent No.: US 8,952,891 B2
(45) Date of Patent: Feb. 10, 2015

(54) DETECTING RESPONSES OF MICRO-ELECTROMECHANICAL SYSTEM (MEMS) RESONATOR DEVICE

(75) Inventors: Hassan Tanbakuchi, Santa Rosa, CA (US); Bernard Legrand, Lille (FR); Damien Ducatteau, Bondues (FR); Didier Theron, Roubaix (FR)

(73) Assignee: Keysight Technologies, Inc., Santa Rosa, CA (US)

( * ) Notice: Subject to any disclaimer, the term of this patent is extended or adjusted under 35 U.S.C. 154(b) by 238 days.

(21) Appl. No.: 13/469,571

(22) Filed: May 11, 2012

(65) Prior Publication Data

US 2013/0169341 A1    Jul. 4, 2013

(30) Foreign Application Priority Data

Jan. 4, 2012  (FR) ...................................... 12 50066

(51) Int. Cl.
  *G01G 5/00*  (2006.01)
(52) U.S. Cl.
  USPC ............ 345/156; 345/158; 345/173; 324/658
(58) Field of Classification Search
  CPC ......... G06F 3/017; G06F 3/0346; H03H 7/40; Y02T 10/7055; Y02T 10/7094; G01R 29/0814; G01R 33/0283; G01R 33/0286
  USPC ............ 324/76.23, 519, 750.17, 754.28, 548, 324/658, 686; 345/156, 158, 173
  See application file for complete search history.

(56) References Cited

U.S. PATENT DOCUMENTS 6,856,140 B2 *  2/2005  Talanov et al. ................ 324/638
7,385,405 B2 *  6/2008  Chen .............................. 324/652
7,408,693 B2 *  8/2008  Kissa et al. ................... 359/245
(Continued)

FOREIGN PATENT DOCUMENTS

JP    2007-078696    *  3/2007  ........... G01R 33/343
JP    2007078696 A      3/2007
(Continued)

OTHER PUBLICATIONS

E. Algre et al., "Surface Microscopy with Laserless MEMS Based AFM Probes", 2010 IEEE 23rd International Conference on Micro Electro Mechanical Systems (MEMS), Publication Year: 2010, pp. 292-295.
(Continued)

*Primary Examiner* — Tung X Nguyen
*Assistant Examiner* — Alesa Allgood

(57) ABSTRACT

A system for detecting responses of a MEMS resonator device includes first and second signal sources, a signal divider and a frequency mixer. The first signal source provides a first signal and the second signal source provides a second signal that electrostatically drives the MEMS resonator device, causing mechanical vibration. The signal divider divides the first signal into a probe signal and a local oscillator (LO) signal, the probe signal being applied to the MEMS resonator device and reflected by a capacitance of the MEMS resonator device. A reflection coefficient is modulated onto the reflected probe signal at the mechanical resonance frequency by variations in the capacitance induced by the mechanical vibration of the MEMS resonator device. The frequency mixer mixes the reflected probe signal and the LO signal and outputs an intermediate frequency (IF) signal, which represents modulation of the reflection coefficient, providing an image of the mechanical vibration.

17 Claims, 6 Drawing Sheets

(56) References Cited

U.S. PATENT DOCUMENTS

| | | | |
|---|---|---|---|
| 7,453,269 B2 * | 11/2008 | Won et al. | 324/658 |
| 2007/0080695 A1 * | 4/2007 | Morrell et al. | 324/658 |
| 2010/0205698 A1 | 8/2010 | Faucher et al. | |
| 2011/0169509 A1 * | 7/2011 | Alini et al. | 324/686 |
| 2011/0304325 A1 * | 12/2011 | Walther et al. | 324/209 |
| 2014/0167789 A1 * | 6/2014 | Cagdaser et al. | 324/683 |

FOREIGN PATENT DOCUMENTS

| | | |
|---|---|---|
| JP | 2007296625 A | 11/2007 |
| WO | 2009153754 A2 | 12/2009 |

OTHER PUBLICATIONS

UK Search Report dated Apr. 8, 2013.

\* cited by examiner

DETECTING RESPONSES OF MICRO-ELECTROMECHANICAL SYSTEM (MEMS) RESONATOR DEVICE

BACKGROUND

There are various types of miniaturized micro-electromechanical systems (MEMS) devices, including MEMS resonator devices, which transpose properties of mechanical resonance in the electrical domain. Potential applications of MEMS resonator devices include electrical signal processing (e.g. filtering, providing time references, etc.) and vibrating sensors (e.g., inertial sensors, mass detectors, label free detectors, pressure sensors, force sensors, etc.), for example. MEMS resonator devices used as vibrating sensors may be incorporated into atomic force microscopy (AFM) applications.

Various physical principles may be used to assure electromechanical transduction performed by the MEMS resonator devices. For example, capacitive transducers are widely employed because they are easily integrated with the mechanical part, and have well established fabrication processes compatible with semiconductor integrated circuit technologies. However, capacitive transducers generally have two drawbacks, as transducers are downsized to reach higher resonance frequencies. First, capacitive transducers present electrical impedance that significantly exceeds the 50-ohm standard. Second, capacitive transducers have parasitic input/output coupling capacitance. Therefore, the measured signal from a capacitive transducer is generally weak and superimposed on a parasitic signal floor, which may mask the desired mechanical resonance signal. The high impedance value (e.g., several kilo-ohm) presented by the MEMS resonator devices to the measurement set-up, typically a vector network analyzer, negates much of the benefit that would be otherwise attained from optimal sensitivity and measurement dynamic. Therefore, electrical characterizations of the MEMS resonator devices exhibit particularly poor signal-to-noise ratios.

SUMMARY

In a representative embodiment, a system for detecting responses of a micro-electro mechanical system (MEMS) resonator device includes first and second signal sources, a signal divider and a frequency mixer. The first signal source is configured to provide a first signal having a first frequency. The second signal source is configured to provide a second signal having a second frequency, the second signal electrostatically driving the MEMS resonator device at about a mechanical resonance frequency, causing mechanical vibration of the MEMS resonator device. The signal divider is configured to divide the first signal into a probe signal and a local oscillator (LO) signal, the probe signal being applied to the MEMS resonator device and reflected by a capacitance of the MEMS resonator device to provide a reflected probe signal where a reflection coefficient is modulated onto the reflected probe signal at the mechanical resonance frequency by variations in the capacitance induced by the mechanical vibration of the MEMS resonator device. The frequency mixer is configured to mix the reflected probe signal and the LO signal and to output an intermediate frequency (IF) signal, the IF signal representing modulation of the reflection coefficient, providing an image of the mechanical vibration of the MEMS resonator device.

In another representative embodiment, a system for detecting microscopic particles in anatomic force microscopy (AFM) application includes first and second signal sources, and a mixer. The first signal source is configured to provide a probe signal to a MEMS resonator device via a first signal path, the probe signal being reflected by a capacitance of the MEMS resonator device to provide a reflected probe signal modulated by a reflection coefficient. The second signal source is configured to provide a stimulus signal to the MEMS resonator device via a second signal path, the stimulus signal electrostatically driving the MEMS resonator device at about a mechanical resonance frequency, causing mechanical vibration of the MEMS resonator device, where the reflection coefficient is modulated on the reflected probe signal by variations in the capacitance induced by the mechanical vibration of the MEMS resonator device. The mixer configured to mix the reflected probe signal and an LO signal, having an LO frequency equal to a frequency of the probe signal, to demodulate the reflected probe signal and to output an IF signal, where the IF signal includes the reflection coefficient for providing an image of the mechanical vibration of the MEMS resonator device.

In another representative embodiment, a method is provided for detecting responses of a MEMS resonator device. The method includes applying a stimulus signal to a first transducer of the MEMS resonator device to induce mechanical vibration; applying a probe signal to a second transducer of the MEMS resonator device; receiving a reflected probe signal from the second transducer of the MEMS resonator device, the reflected probe signal having a reflection coefficient modulated onto the reflected probe signal at a resonance frequency of the MEMS resonator device by variations in a capacitance of the second transducer induced by the mechanical vibration of the MEMS resonator device; and demodulating the reflected probe signal with an LO signal to obtain an IF signal, providing an image of mechanical vibration, the LO signal having the same frequency as the probe signal.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
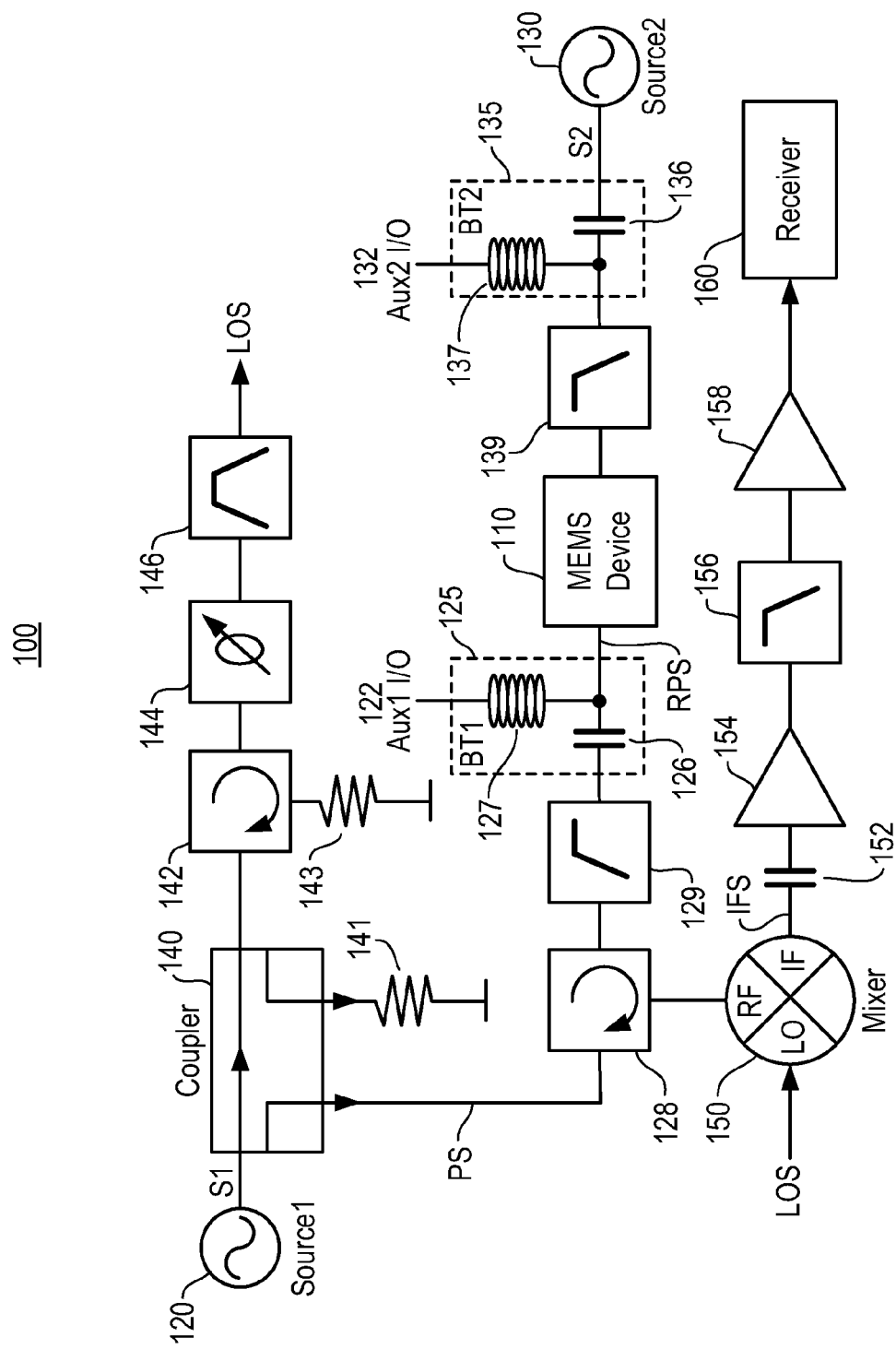
FIG. 1 is a block diagram illustrating a system for providing microwave measurement of a micro-electro mechanical systems (MEMS) resonator device, according to a representative embodiment.

In the following detailed description, tor purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings.

Generally, it is understood that the drawings and the various elements depicted therein are not drawn to scale. Further, relative terms, such as "above," "below," "top," "bottom," "upper," "lower," "left," "right," "vertical" and "horizontal," are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be "below" that element. Likewise, if the device were rotated 90 degrees with respect to the view in the drawings, an element described as "vertical," for example, would now be "horizontal."

Generally, various representative embodiments provide systems and methods for detecting responses of a micro-electro mechanical system (MEMS) resonator device. The embodiments circumvent previous limitations and provide electromechanical measurements of MEMS resonator devices featuring excellent signal-to-noise ratio and large rejection of parasitic capacitive coupling signals.

FIG. 1 is a block diagram illustrating a system for providing microwave measurement of a micro-electromechanical systems (MEMS) resonator device, according to a representative embodiment.

Referring to FIG. 1, measurement system 100 includes MEMS resonator device 110, which may be referred to as a device under test (DUT). In an embodiment, the measurement system 100 may be used in an AFM application, for example, where the MEMS resonator device 110 acts as a vibrating sensor. That is, microscopic particles attach to a vibrating portion of the MEMS resonator device 110 (e.g., ring resonator 115, discussed below), which alters the frequency of mechanical resonance and the frequency response transfer function. An example of a MEMS resonator device is described by Faucher et al. in U.S. Patent Application Publication Number 2010/0205698, entitled "Atomic Force Microscopy Probe" (Aug. 12, 2010), which is hereby incorporated by reference. The alteration in the frequency is detected, e.g., by receiver 160, indicating the presence and/or type of microscopic particles.

In the depicted embodiment, the MEMS resonator device 110 has two ports. A first port is connected to a first signal source 120 via a first signal path and the second port is connected to a second signal source 130 via a second signal path, where the first signal source 120 provides first signal S1 and the second signal source 130 provides second signal S2. Generally, the first signal path includes (optional) circulator 128, high-pass filter 129 and (optional) first bias-tee 125, and the second signal path includes second bias-tee 135 and low-pass filter 139, details of which are discussed below.

Figure 2:
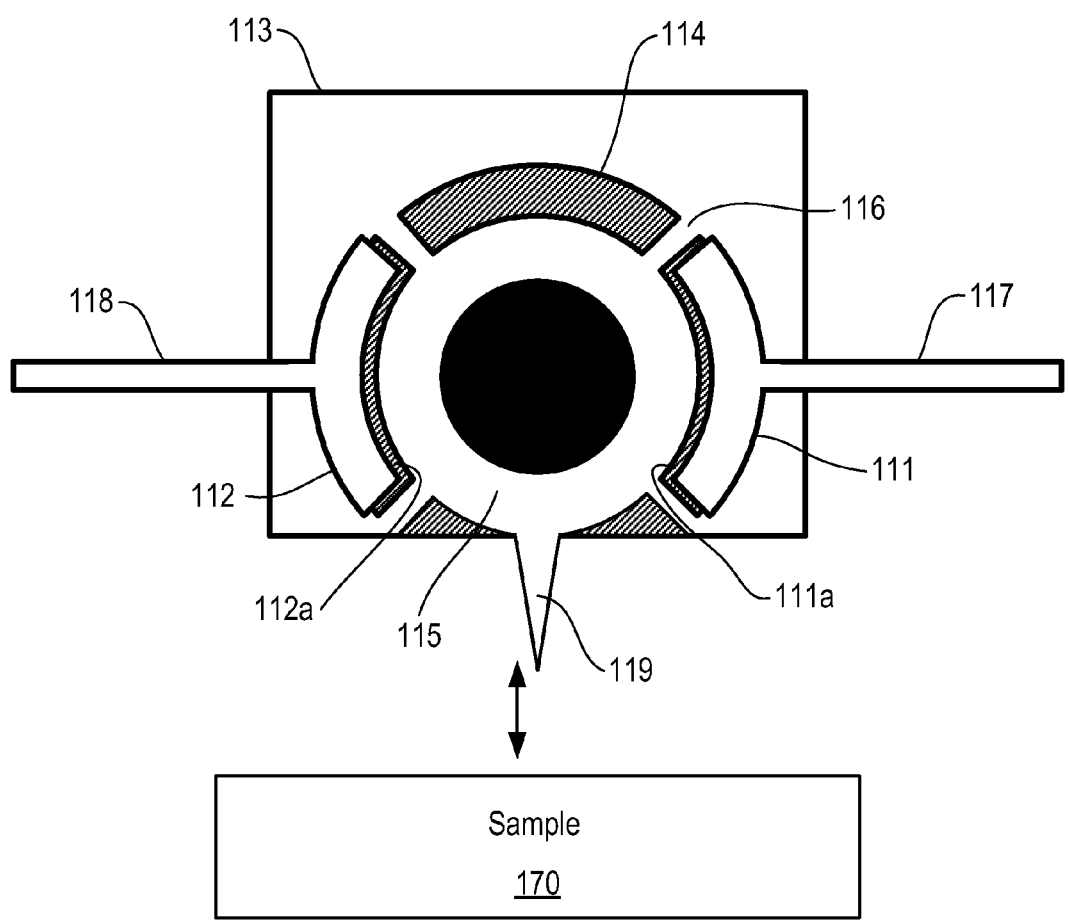
FIG. 2 is a top plan view of an illustrative MEMS resonator device of FIG. 1.

FIG. 2 is a top plan view of an illustrative MEMS resonator device that may be incorporated as the MEMS resonator device 110 of FIG. 1, according to a representative embodiment. Of course, other types of MEMS resonator devices, with or without ring oscillators, may be incorporated without departing from the scope of the present teachings. Referring to FIG. 2, the MEMS resonator device 110 includes a ring resonator 115 suspended in cavity 114 by four connectors 116, which may be membranes, for example, arranged at substantially equal intervals around the outer perimeter of the ring resonator 115. The cavity 114 is formed in substrate 113. The MEMS resonator device 110 further includes a scanning probe microscopy (SPM) tip or probe tip 119, which contacts a surface of sample 170, causing changes in the mechanical movement or vibration of the ring resonator 115. The general direction of the mechanical movement is indicated by an arrow. It is understood that the MEMS resonator device 110 may include types of resonators other than representative ring resonator 115, such as a thin piezoelectric layer resonator, in various configurations, without departing from the scope of the present teachings.

The MEMS resonator device 110 further includes electromechanical capacitive transducers, shown as first (input) capacitive transducer 111 and second (output) capacitive transducer 112. The first capacitive transducer 111 is separated from an outer perimeter of the ring resonator 115 by first capacitive air gap 111a, and the second capacitive transducer 112 is separated from the outer perimeter of the ring resonator 115 by second capacitive air gap 112a on an opposite side of the ring resonator 115 from the first capacitive air gap 111a. The first capacitive transducer 111 is used to drive the MEMS resonator device 110 close to its resonance frequency, causing corresponding vibration of ring resonator 115. The second capacitive transducer 112 is used to sense mechanical displacements of the ring resonator 115. Tire first and second capacitive transducers 111 and 112 receive and send electrical signal signals (e.g., second signal S2, probe signal PS and reflected probe signal RPS, discussed below) via conductors 117 and 118, respectively.

The substrate 113 may be formed of any appropriate substrate material, such as silicon (Si), gallium arsenide (GaAs), indium phosphide (InP), glass, or the like. The ring resonator 115 and the connectors 116 may be formed of any material that provides mechanical vibration in response to a stimulus signal (e.g., second signal S2), such as Si or Si based material (doped for conductivity), GaAs or InP, for example. The conductors 117 and 118 are formed of any appropriate conductive material, such as gold (Au), copper (Cu), aluminum (Al), or the like.

Referring again to FIG. 1, the first signal S1 provided by the first signal source 120 is a microwave signal having a first frequency in the range of about 1 GHz to about 50 GHz, for example. The available power of the first signal source 120 is divided into two parts by signal divider 140, providing the probe signal PS to the first signal path and a local oscillator (LO) signal LOS provided to a LO signal path, discussed below. The first signal 81, the probe signal PS and the LO signal LOS have the same frequency (i.e., the first frequency). The signal divider 140 may be a directive coupler or a resistive divider, for example, connected to ground via resistor 141.

The second signal S2 provided by the second signal source 130 is a radio frequency (RF) signal having a second frequency in the range of about 1 MHz to about 300 MHz, for example. The second frequency is selected so that the second signal S2 electrostatically drives the MEMS resonator device 110 at about its mechanical resonance frequency, causing mechanical vibration of the ring resonator 115 in the MEMS resonator device 110.

More particularly, the second signal source 130 provides the second signal S2 to the second signal path, which includes the second bias-tee 135 and the low-pass filter 139. The second bias-tee 135 includes capacitor 136, connected in series between the second signal source 130 and the low-pass filter 139, and inductor 137, connected between second auxiliary input/output 132 and the capacitor 136. The second bias-tee 135 applies DC bias from the second auxiliary input/output 132 to the second signal 82 to produce an electrostatic driving force, in conjunction with the second signal source 130 in MHz frequencies and DC, input to the MEMS resonator device 110. The low-pass filter 139 provides isolation from higher frequencies existing in other parts of the measurement system 100. The cut-off frequency of the low-pass filter 139 is greater than the highest frequency generated by the second signal source 130.

As mentioned above, the first signal S1 is divided into the probe signal PS and the LO signal LOS by the signal divider 140, each of which has the microwave carrier frequency of the first signal S1. The probe signal PS is used to sense the mechanical vibration of the MEMS resonator device 110. The probe signal PS is applied to the MEMS resonator device 110 through the circulator 128, the high-pass filter 129 and the (optional) first bias-tee 125 of the first signal path. In various configurations, other types of isolating components, such as a coupler, may be used in place of the circulator 128. The high-pass filter 129 provides isolation from higher frequencies existing in other parts of the measurement system 100, as well as reduces leakage of the second signal source 130 back to the circulator 128, keeping frequency mixer ("mixer") 150 in linear operation and out of saturation. The cut-off frequency of the high-pass filter 129 is greater than the cut-off frequency of the low-pass filter 139 and lower than the first frequency of the first signal S1 generated by the first signal source 120.

The first bias-tee 125 includes capacitor 126, connected in series between the high-pass filter 129 and the MEMS resonator device 110, and inductor 127, connected between first auxiliary input/output port 122 and the capacitor 126. The first bias-tee 125 applies DC bias from the first auxiliary input/output port 122 to the probe signal PS. That is, the first auxiliary input/output port 122 enables DC bias to be superimposed onto the probe signal PS through first bias-tee 125. The first auxiliary input/output port 122 further enables extraction of any low frequency signal output by the MEMS resonator device 110 for analysis. For example, reflection and transmission parameters of MEMS resonator device 110 may be measured via the first auxiliary input/output port 122 at the frequency of the second signal S2 from the second signal source 130 (i.e., the resonance frequency of the MEMS resonator device 110). Changes in mechanical resonance parameters of the MEMS resonator device 110 driven by the second signal source 130 caused by external influences (e.g., interaction of the probe tip 119 and the surface of the sample 170) are superimposed onto the frequency of the reflected probe signal RPS. In other words, the frequency response transfer function of the MEMS resonator device 110 is modulated on reflected probe signal (RPS) and demodulated via the mixer 150, discussed below, such that measurements may be performed by the receiver 160, for example, or other measuring instrument.

In the depicted embodiment, the probe signal PS is reflected by the second capacitive transducer 112 of the MEMS resonator device 110, providing the reflected probe signal RPS. The corresponding reflection coefficient of the reflected probe signal RPS is modulated by variations in capacitance of the second capacitive transducer 112. These variations in the capacitance are induced by the mechanical vibration of the ring resonator 115 in the MEMS resonator device 110, resulting from application of the second signal S2 (stimulus signal), as discussed above. The reflected probe signal RPS travels through the first bias-tee 125 and the high-pass filter 129, and is separated from the incident probe signal PS by the circulator 128. The separated reflected probe signal RPS is then applied to an RF input port of the mixer 150. It is understood that addition electrical components, such as attenuators and/or amplifiers, may be included in the first signal path of the probe signal PS and the reflected, probe signal RPS to adjust the respective power levels, as would, be apparent to one of ordinary skill in the art.

Meanwhile, as mentioned, above, the LO signal LOS output by the signal divider 140 is provided to the LO signal path, which includes (optional) circulator 142, phase shifter 144 and band-pass filter 146. The circulator 142 is used as an isolator, and may be connected to ground via resistor 143. In various configurations, other types of components, such as an amplifier, may be used in place of the circulator 142. The phase shifter 144 adjusts a delay of the LO signal LOS, and the band-pass filter 146 filters the LO signal LOS to remove added noise and spurious signals. The center frequency of the band-pass filter 146 is substantially the same as the center frequency of the first signal S1, provided by the first signal source 120. The LO signal LOS output from the band-pass filter 146 of the LO signal path is applied to the LO input port of the mixer 150. It is understood that additional electrical components, such as attenuators and/or amplifiers, may be included in the LO signal path to adjust the powrer level, e.g., depending on the requirements of the mixer 150, as would be apparent to one of ordinary skill in the art. The phase adjustment of the LO signal LOS by the phase shifter 144 optimizes operation of the mixer 150, wrhich may operate as a homodyne downconverter, for example.

Intermediate frequency (IF) signal IFS is available at an IF output port of the mixer 150. The IF signal IFS represents the modulation of the reflected probe signal RPS provided to the RF input port of the mixer 150. Thus, the IF signal IFS represents the modulation of the reflection coefficient of the reflected probe signal RPS, described above, and provides an image of the mechanical vibration of the MEMS resonator device 110. As mentioned above, the phase shifter 144 adjusts the delay of the LO signal LOS to insure that the LO signal LOS, input to an LO input port of the mixer 150, and the reflected portion of reflected probe signal RPS that is caused by the changes of the capacitance of the ring resonator 115 at equilibrium (refer to Equation (1) below) input to the RF input port of the mixer 150, are in phase (or 180 degrees out of phase) for optimum performance. Also, since the main part of the reflected probe signal RPS that is caused by the ring resonator capacitance at equilibrium and the portion that is caused by changes of the capacitance from equilibrium are orthogonal (90 degree out of phase), the portion output by the mixer 150 that corresponds to main part of reflection will be zero (or highly attenuated), since the LO signal LOS and the main part of the reflected probe signal RPS are 90 degrees out of phase and a homodyne mixer is used as a down converter.

Also, the main portion of the reflected probe signal RPS has far greater amplitude than the portion of the reflected probe signal RPS signal caused by the changes of the capacitance of the ring resonator 115 from equilibrium. Attenuating the main portion of reflected probe signal RPS through the homodyne mixer helps to elevate the possibility of overdriving IF signal processing components. Also, phase noise of the reflected probe signal RPS will be down converted to the IF signal IFS via the LO signal LOS (90 degree phase shift between the two signals), which may degrade the signal to noise ratio of the measurement. Therefore a signal with low phase noise should be used as a driving signal. Since the MEMS resonator operates at tens of MHZ, a source with low phase noise at tens of MHZ away from the carrier is easily obtained, commercially.

The IF signal IFS is provided to the receiver 160 via an IF signal path, which includes block capacitor 152, first amplifier 154, low-pass filter 156 and second amplifier 158 (optional). The block capacitor 152 suppresses the DC component of the IF signal IFS. The IF signal IFS is then amplified by the first amplifier 154, which may be a low-noise amplifier, for example. The low-pass filter 156 eliminates undesirable high frequencies components. The second amplifier 158 may also be included in the IF signal path for additional amplification of the IF signal IFS.

The amplified IF signal IFS is provided to an input port of the receiver 160, for example, to be analyzed in terms of magnitude and phase. The magnitude and phase of the IF signal IFS as compared to the second signal S2 represents dynamic change in the MEMS resonator device 110. For example, the MEMS resonator device 110 with probe tip 119 may be used for AFM imaging to measure mechanical properties of the surface of the sample 170, such as topography, elasticity and the like. This can be achieved via comparison of the IF signal IFS and the second signal S2 as a reference. Also, the IF signal IFS may be used to measure any other changes, such as biological binding, which change the weight at the end of the probe tip 119 and therefore change the mechanical resonance of the MEMS resonator device 110. For an AC or tapping mode AFM, the magnitude and phase of the fundamental and harmonics of the IF signal IFS may be analyzed with respect to the second signal S2 as a reference, e.g., to determine surface properties of the material being imaged. Such analysis would be apparent to the one of ordinary skill in the art regarding AC or tapping mode AFM imaging.

Examples of the receiver 160 include a lock-in amplifier, a spectrum analyzer, a vector network analyzer, and the like. For example, the receiver 160 may be a PNA-X Series Nonlinear Vector Network Analyzer (NVNA), available from Agilent Technologies, Inc., or other large-signal network analyzer. In an embodiment, the second signal source 130 may be combined with the receiver 160, e.g., in the NVNA, or may be an RF signal generator, available from Agilent Technologies, Inc. The first signal source 120 may be a microwave synthetizer, such as an E6432A VXI Microwave Synthesizer, also available from Agilent Technologies, Inc.

Measurement sensitivity of the measurement system 100 is calculated from the reflection coefficient of the reflected probe signal RPS, which is sensed in the plane of the second capacitive transducer 112 of MEMS resonator device 110, as discussed above. For example, the reflection coefficient of the reflected probe signal may be provided by Equation (1), below:

$$\rho(\chi) = \rho_0 \left[ 1 + \frac{2\omega Z_C}{1 + C^2 \omega^2 Z_C^2} e^{-j\pi/2} dC \right] \quad \text{Equation (1)}$$

Referring to Equation (1), $\rho(\chi)$ is the reflection coefficient bringing about the reflected probe signal RPS in the plane of the second capacitive transducer 112 as a function of displacement $\chi$ of the vibrating ring resonator 115. The reflection coefficient as indicated by Equation (1) has two main parts, where $\rho_0$ is the main part of the reflection and is caused by the capacitor in equilibrium. The second component of the reflection corresponds to the change in the reflection coefficient with small mechanical displacement $\chi$ caused by the ring resonator vibration. The portion of the reflected probe signal RPS that is caused by the changes of the capacitance at equilibrium is phase shifted by $-90$ degrees from the main portion of the reflected probe signal RPS, which is given by $\exp(-j\pi/2)$. C is the capacitor value of the second capacitive transducer 112 at equilibrium, dC is the variation of the capacitor value when the vibrating ring resonator 115 of the MEMS resonator device 110 moves from its equilibrium position by an amount $\chi$, $Z_C$ is the characteristic impedance (e.g., 50$\Omega$), and $\omega$ is the pulsation of the probe signal PS provided by the first signal source 120.

Assuming that the mechanical displacement $\chi$ is small, the capacitor variation dC can be considered as proportional to the mechanical displacement $\chi$, in which case the information related to the vibration is in quadrature with respect to the main part of the reflection coefficient. The main part of the reflection coefficient is the capacitance when the vibrating ring resonator 115 is at its equilibrium. As mentioned above, $\rho_0$ is the reflection coefficient at equilibrium. The quadrature for the snail mechanical displacement $\chi$ comes from $\exp(-j\pi/2)$ with respect to $\rho_0$. The measurement sensitivity of the measurement system 100 to the capacitor variation dC may thus be given by S in Equation (2):

$$S = \frac{2\omega Z_C}{1 + C^2 \omega^2 Z_C^2} \quad \text{Equation (2)}$$

In Equation (2), the measurement sensitivity S is at its maximum when $\omega = 1/Z_C C$, in which case $S_{max} = 1/C$. Further calculations taking into account the signal noise show that measurement resolution up to the zepto-Farad can be achieved in practical cases, where $Z_C$ is characteristic impedance, e.g., 50 Ohm, and $\omega$ is the angular frequency of the first signal S1.

An illustrative, non-limiting configuration of the measurement system 100 was assembled for observing various characteristics, according to a representative embodiment. In the illustrative configuration, the ring resonator 115 of the MEMS resonator device 110 was a silicon ring resonator having a ring diameter of 60 μm, a thickness of 5 μm, and a calculated resonance frequency is about 25 MHz. The first and second capacitive transducers 111 and 112 located along portions of the outer perimeter of the ring resonator 115 formed first and second capacitive air gaps 111a and 112a of about 100 nm, each.

The first signal source 120 generated the first signal S1 having a frequency of about 4 GHz at a power of about 13 dBm. The signal divider 140 directed about 3 dBm of the power to the probe signal PS, and about 10 dBm of the power to the LO signal LOS. The second signal source 130 generated the second signal S2 having a frequency of about 25 MHz for stimulating the ring resonator 115 of the MEMS resonator device 110. The power of the second signal source 130 was adjustable, and a 10 V DC bias was applied to the second signal S2 via second auxiliary input/output 132 and the second bias-tee 135.

The first and second amplifiers 154 and 158 each featured about 20 dB gain in the 20 MHz to 30 MHz frequency band and 3 dB noise figure. The first auxiliary input/output port 122 was connected to a receiver of a multiport vector analyzer, in order to measure simultaneously the "classical" S21 transmission parameter of the MEMS resonator device 110. If one replaces the second signal source 130 with the first port of a vector network analyzer (VNA), and connects the second port of the VNA to the input port of the first bias-tee 125 in place of the high-pass filter 129, one can characterize the parameters of the MEMS resonator device 110 at an RF frequency (here is ~25 MHz). These results are shown in traces 502 and 503 of FIG. 5, below. In the case of the RF measurement, the MEMS transmission measurement at RF shows a great deal of loss, and therefore very low sensitivity. The phase shifter 144 was tuned to adjust the phase of the LO signal LO, and to maximize the IF signal IFS output by the mixer 150 and received by the receiver 160. The LO signal LOS and reflected probe signal RPS at the mixer 150 should be inphase or 180 degrees out of phase for optimum performance.

Figure 3:
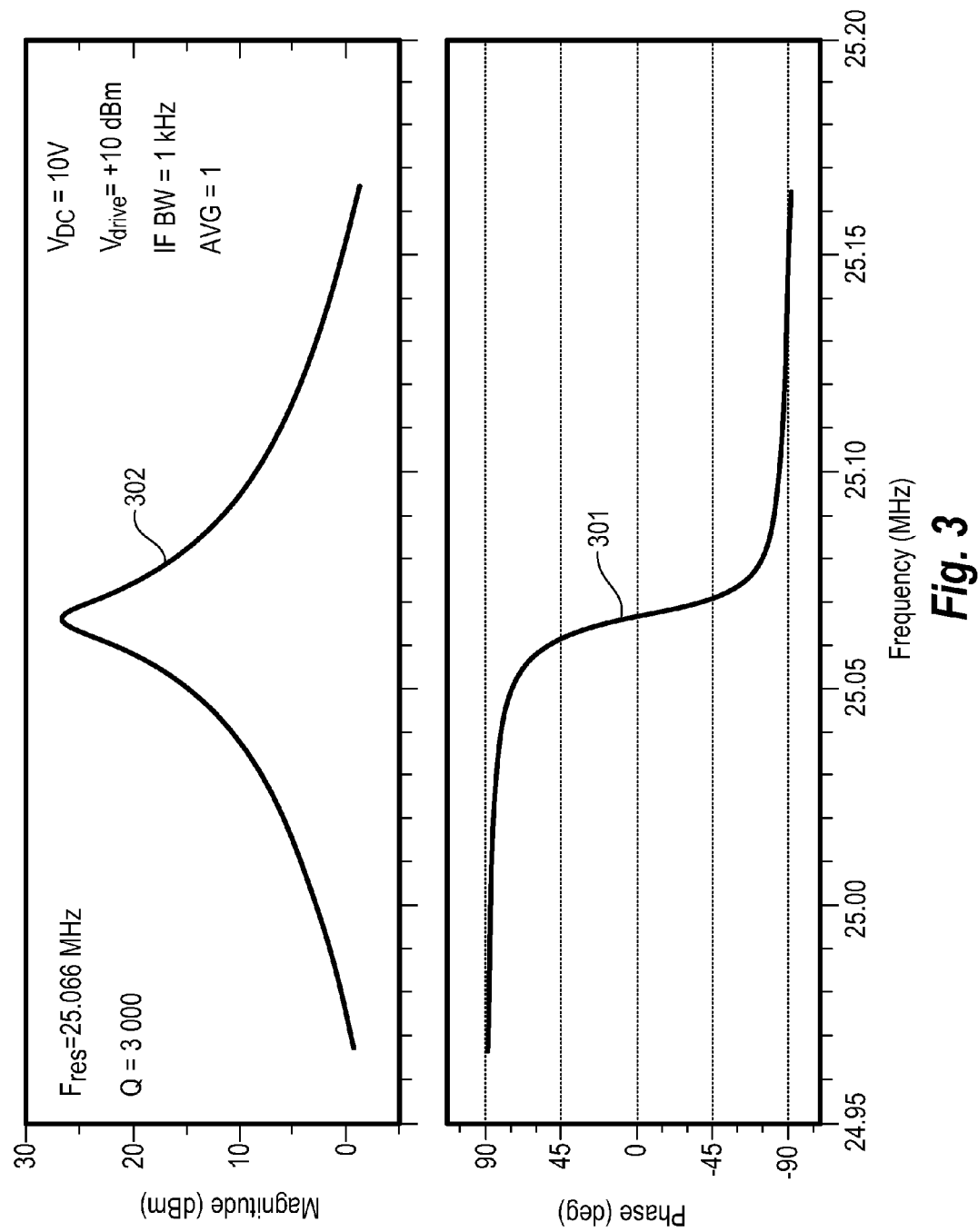
FIG. 3 includes traces showing frequency response of a MEMS resonator device driven by the microwave measurement system of FIG. 1, according to a representative embodiment.

FIG. 3 includes traces showing frequency response of a MEMS resonator device 110 driven by the microwave measurement system of FIG. 1, according to a representative embodiment, configured as described above, where fres is the resonance frequency of the MEMS resonator device 110 (25.066 MHz), Vdc is the DC bias voltage applied at the second bias-tee 135 (10V), $P_{drive}$ is the power of the second signal S2, and IF BW is the measurement bandwidth of the IF signal IFS output by the mixer 150. Trace 301 shows the phase characterization of the MEMS resonator device 110, where the phase shift of the IF signal IFS from 90 degrees to −90 degrees occurs at the resonance frequency 25.066 MHz of the MEMS resonator device 110. Generally, as discussed above, the MEMS resonator device 110 is driven by the second signal 82 from the second signal source 130, having an RF frequency of about 25 MHZ. The first signal 81 from the first signal source 120 is split into two paths, providing the LO signal LOS and the probe signal PS, respectively. The LO signal LOS is amplified and phase shifted, and the probe signal PS is applied to the MEMS resonator device 110 as an incident microwave signal. The incident microwave signal encounters the capacitive load impedance of the MEMS resonator device 110, and is reflected as the reflected probe signal RPS. This capacitance changes about the equilibrium capacitance of the MEMS resonator device 110 due to the ring vibration at the rate of the MEMS resonance frequency, resulting in dC (givenby Equation (2)), which is the deviation from the equilibrium capacitance. The reflected probe signal RPS, modulated at the same frequency as the second signal S2, is ultimately mixed by the mixer 150 with the LO signal LOS, which has the same carrier frequency as the reflected probe signal RPS. The mixer 150 thus demodulates the reflected probe signal RPS to provide the IF signal IPS, which is delivered to the receiver 160. The IF signal IFS is shown as trace 302 of FIG. 3 (and trace 501 of FIG. 5). More particularly, trace 302 shows the magnitude characterization of the MEMS resonator device 110, which peaks at about 27 dBm at the resonance frequency 25.066 MHz.

Figure 4:
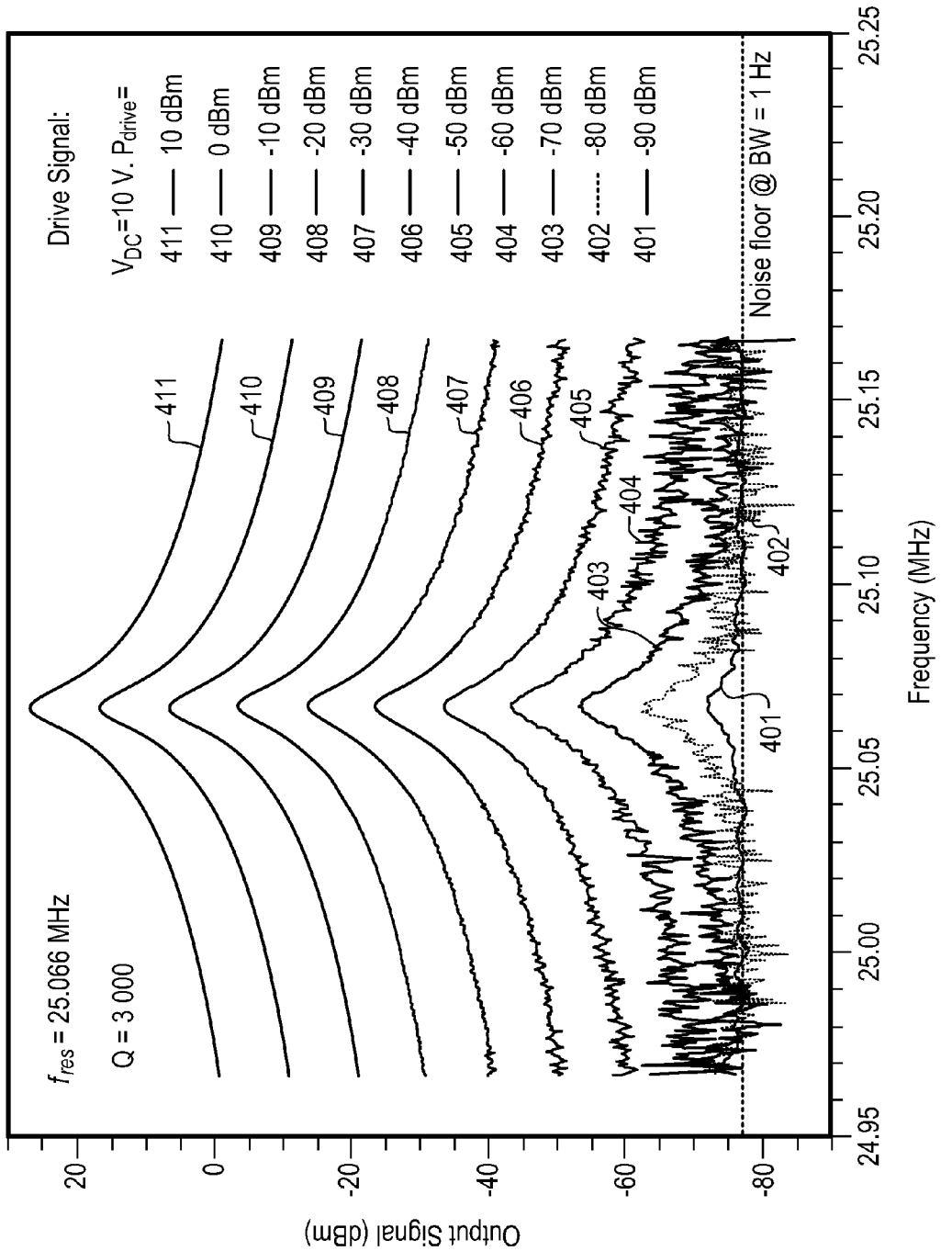
FIG. 4 includes traces showing performance of a MEMS resonator device (signal-to-noise ratio) driven by the microwave measurement system of FIG. 1, according to a representative embodiment.

FIG. 4 includes traces showing measurement dynamics of a MEMS resonator device 110 driven by the microwave measurement system of FIG. 1, according to a representative embodiment, configured as described above. In particular, FIG. 4 shows traces 401-411 corresponding to frequency responses of the MEMS resonator device 110 at different drive powers $P_{drive}$ of the second signal S2, beginning at −90 dBm and separated by 10 dBm. In other words, traces 401-411 show the frequency responses of the MEMS resonator device 110 at drive power $P_{drive}$=−90 dBm, −80 dBm, −70 dBm, −60 dBm, −50 dBm, −40 dBm, −30 dBm, −20 dBm, −10 dBm, 0 dBm and 10 dBm, respectively. As shown in FIG. 4, the measurement dynamic of the illustrate MEMS resonator device 110 is greater than 100 dB. This corresponds to more than five orders of magnitude for the measurement of the resonator vibration amplitude of the MEMS resonator device 110.

The measurement system 100 provides the ability to measure minute changes the capacitance of the MEMS resonator device 110 from its equilibrium condition (i.e., the resonator vibrating in air). For example, in an illustrative embodiment, as the ring resonator 115 in conjunction with the integrated probe tip 119 approaches a surface of the sample 170, just before the probe tip 119 touches the surface it experiences molecular Van der Waals force, effecting the ring resonator 115 excretion by approximately 0.1 Å (Angstrom), which translates to changes in the dynamic capacitance of the MEMS resonator device 110 by sub-atto Farad. The RF measurement is not capable of sensing such a minute changes due to poor SNR, while the measurement system 100 is able to perform such measurement.

Figure 5:
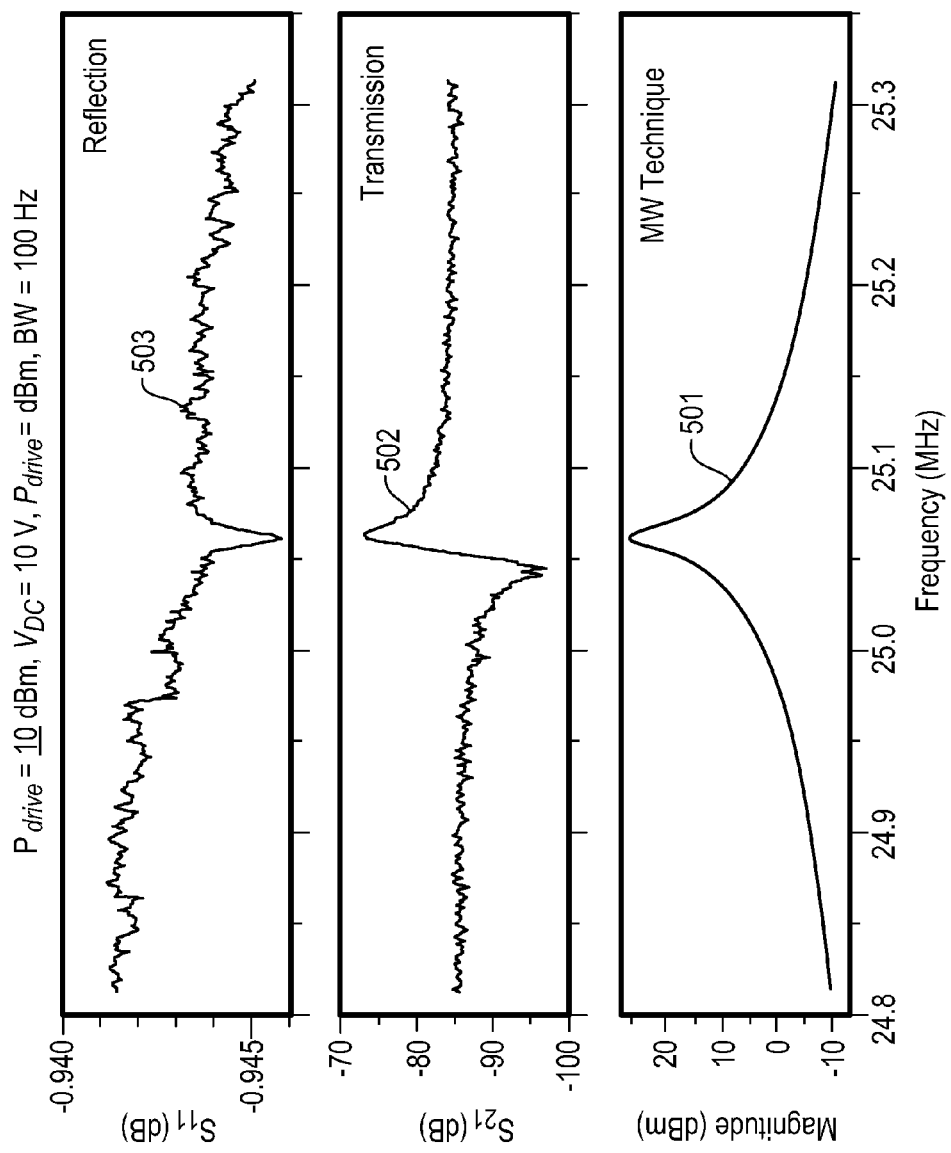
FIG. 5 includes traces showing S-parameter measurements and frequency response of a MEMS resonator device driven by the microwave measurement system of FIG. 1, according to a representative embodiment.

FIG. 5 includes traces showing S-parameter measurements and frequency response of a MEMS resonator device 110 driven by the microwave measurement system of FIG. 1, according to a representative embodiment, configured as described above. In particular, trace 501 of FIG. 5 shows the measured magnitude characterization of the frequency response of the MEMS resonator device 110. The magnitude characterization peaks at about 27 dBm at the resonance frequency 25.066 MHz, as discussed above in regard to FIG. 3. Traces 502 and 503 show classical S-parameter measurements of transmission ($S_{21}$) and reflection ($S_{11}$) of the MEMS resonator device 110 (e.g., taken from first auxiliary input/output port 122) under the same driving conditions. Upon comparison, trace 501 shows improved signal-to-noise ratio, as well as complete suppression of parasitic coupling signals. That is, comparing trace 501 to 502, one can readily determine the increase sensitivity when RF stimulus (e.g., second signal S2) is used. One can use a locking amplifier, for example, to compare the IF signal IFS and second signal S2 to gain insight into nano scale topography.

Figure 6:
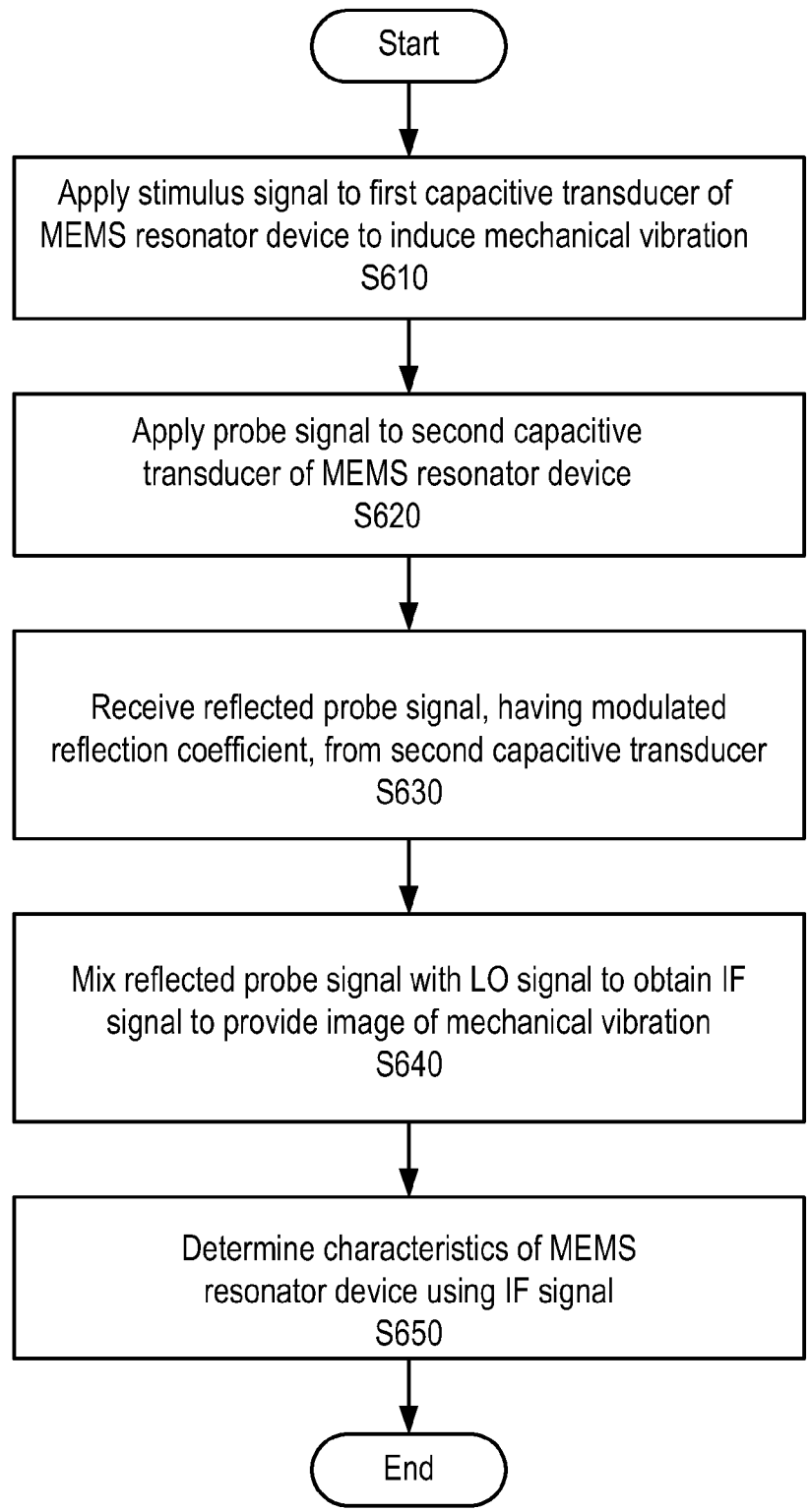
FIG. 6 is a flow diagram depicting a method for detecting responses of a MEMS resonator device, according to a representative embodiment.

FIG. 6 is a flow diagram depicting a method for detecting responses of a MEMS resonator device, according to a representative embodiment.

Referring to FIGS. 1, 2 and 6, a stimulus signal (e.g., second signal S2) is applied to the first capacitive transducer 111 of the MEMS resonator device 110 in block S610 to induce mechanical vibration of the MEMS resonator device 110. The frequency of the stimulus signal is selected so that the MEMS resonator device 110 is electrostatically driven about its mechanical resonance frequency, causing mechanical vibration of the ring resonator 115. The stimulus signal may be provided by an RF signal source (e.g., second signal source 130).

In block S620, a probe signal (e.g., probe signal PS) is applied to the second capacitive transducer 112 of the MEMS resonator device. In response, a reflected probe signal (e.g., reflected probe signal RPS) is received from the second capacitive transducer 112 of the MEMS resonator device 110 in block S630. The reflected probe signal has a reflection coefficient modulated by variations in a capacitance of the second capacitive transducer 112, where the variations in the capacitance are induced by the mechanical vibration of the MEMS resonator device 110.

The reflected probe signal is mixed with a local oscillator (LO) signal (e.g., LO signal LOS) in block S640 to obtain an intermediate frequency (IF) signal (e.g., IF signal IFS). As discussed above, the IF signal provides an image of mechanical vibration of the MEMS resonator device 110. The LO signal has the same frequency as the probe signal. In an embodiment, the LO signal and the probe signal may be obtained by dividing a microwave signal provided by the same signal source (e.g., first signal source 120). In block S650, the characteristics of the MEMS resonator device 110 are determined using the IF signal, for example, by the receiver 160.

While specific embodiments are disclosed herein, many variations are possible, which remain within the concept and scope of the invention. Such variations would become clear after inspection of the specification, drawings and claims herein. The invention therefore is not to be restricted, except within the scope of the appended claims.

What is claimed is:

1. A system for detecting responses of a micro-electromechanical system (MEMS) resonator device, the system comprising:
    a first signal source configured to provide a first signal having a first frequency;
    a second signal source configured to provide a second signal having a second frequency corresponding to a mechanical resonance frequency of the MEMS resonator device, the second signal electrostatically driving the MEMS resonator device at approximately the mechanical resonance frequency, causing mechanical vibration of the MEMS resonator device;
    a signal divider configured to divide the first signal into a probe signal and a local oscillator (LO) signal, the probe signal being applied to the MEMS resonator device and reflected by a capacitance of the MEMS resonator device to provide a reflected probe signal, wherein a reflection coefficient is modulated onto the reflected probe signal at the mechanical resonance frequency by variations in the capacitance induced by the mechanical vibration of the MEMS resonator device; and
    a mixer configured to mix the reflected probe signal and the LO signal and to output an intermediate frequency (IF) signal, the IF signal representing modulation of the reflection coefficient, providing an image of the mechanical vibration of the MEMS resonator device.

2. The system of claim 1, further comprising:
    a phase shifter configured to phase shift the LO signal in order to optimize operation of the frequency mixer.

3. The system of claim 1, wherein the first frequency is a microwave frequency.

4. The system of claim 1, wherein the signal divider comprises a directive coupler or a resistive divider.

5. The system of claim 1, further comprising:
    a receiver configured to receive the IF signal for analysis of changes in amplitude and phase of the IF signal.

6. The system of claim 5, wherein the receiver comprises one of a lock-in amplifier, a spectrum analyzer or a vector network analyzer.

7. A system for detecting microscopic particles in an atomic force microscopy (AFM) application, the system comprising:
    a first signal source configured to provide a probe signal to a micro-electromechanical system (MEMS) resonator device via a first signal path, the probe signal being reflected by a capacitance of the MEMS resonator device to provide a reflected probe signal modulated by a reflection coefficient;
    a second signal source configured to provide a stimulus signal to the MEMS resonator device via a second signal path, the stimulus signal electrostatically driving the MEMS resonator device at about a mechanical resonance frequency, causing mechanical vibration of the MEMS resonator device, wherein the reflection coefficient is modulated on the reflected probe signal by variations in the capacitance induced by the mechanical vibration of the MEMS resonator device;
    a mixer configured to mix the reflected probe signal and a local oscillator (LO) signal, having an LO frequency equal to a frequency of the probe signal, to demodulate the reflected probe signal and to output an intermediate frequency (IF) signal, wherein the IF signal includes the reflection coefficient for providing an image of the mechanical vibration of the MEMS resonator device; and
    a receiver configured to receive the IF signal from the mixer via an IF signal path to be analyzed in terms of at least one of magnitude and phase, the IF signal path comprising a block capacitor configured to suppress a DC component of the IF signal.

8. The system of claim 7, wherein the IF signal path further comprises:
    at least one amplifier configured to amplify the IF signal; and
    a low-pass filter configured to eliminate undesirable high frequencies components.

9. The system of claim 7, further comprising:
    a signal divider configured to receive a first signal from the first signal source, and to divide available power of the first signal source into the probe signal provided to the first signal path and the LO signal provided to an LO signal path.

10. The system of claim 9, wherein the signal divider comprises one of a directive coupler or a resistive divider.

11. The system of claim 9, wherein the LO signal path comprises:
    a phase shifter configured to adjust a delay of the LO signal from the signal divider; and
    a band-pass filter configured to remove at least one of added noise and spurious signals from the phase shifted LO signal, a center frequency of the band-pass filter being substantially the same as a center frequency of the first signal.

12. The system of claim 7, wherein the first signal path comprises:
    a high-pass filter for filtering the probe signal; and
    a first bias-tee for applying DC bias to the filtered probe signal.

13. The system of claim 12, wherein the second signal path comprises:
    a second bias-tee for applying DC bias to the stimulus signal; and
    a low-pass filter for filtering the DC-biased stimulus signal.

14. A method for detecting responses of a micro-electromechanical system (MEMS) resonator device, the method comprising:
    applying a stimulus signal to a first transducer of the MEMS resonator device to induce mechanical vibration, the stimulus signal having a frequency corresponding to a mechanical resonance frequency of the MEMS resonator device;
    applying a probe signal to a second transducer of the MEMS resonator device;
    receiving a reflected probe signal from the second transducer of the MEMS resonator device, the reflected probe signal having a reflection coefficient modulated onto the reflected probe signal at the resonance frequency of the MEMS resonator device by variations in a capacitance of the second transducer induced by the mechanical vibration of the MEMS resonator device; and demodulating the reflected probe signal with a local oscillator (LO) signal to obtain an intermediate frequency (IF) signal, providing an image of mechanical vibration, the LO signal having the same frequency as the probe signal.

15. The method of claim 14, further comprising:
determining characteristics of the MEMS resonator device using the IF signal.

16. The method of claim 14, further comprising:
adjusting a delay of the LO signal so that the LO signal and the reflected probe signal are in phase or 180 degrees out of phase.

17. The method of claim 16, further comprising:
dividing a microwave signal into the probe signal and the LO signal.

* * * * *